United States Patent
Kim et al.

(10) Patent No.: US 9,966,761 B1
(45) Date of Patent: May 8, 2018

(54) LOAD CURTAILMENT ON AN ELECTRICAL GRID

(71) Applicant: Google LLC, Mountain View, CA (US)

(72) Inventors: Sangsun Kim, San Jose, CA (US); Anand Ramesh, Sunnyvale, CA (US); Ronald Scott Collyer, Grass Valley, CA (US); Jyoti Sastry, San Jose, CA (US); Arunava Majumdar, Orinda, CA (US)

(73) Assignee: Google LLC, Mountain View, CA (US)

( * ) Notice: Subject to any disclaimer, the term of this patent is extended or adjusted under 35 U.S.C. 154(b) by 568 days.

(21) Appl. No.: 14/285,978

(22) Filed: May 23, 2014

(51) Int. Cl.
- H02J 3/14 (2006.01)
- G01R 19/00 (2006.01)
- H02J 4/00 (2006.01)
- H02J 3/00 (2006.01)
- G06Q 50/06 (2012.01)

(52) U.S. Cl.
CPC ............ H02J 3/14 (2013.01); G01R 19/0084 (2013.01); H02J 4/00 (2013.01); G06Q 50/06 (2013.01); H02J 2003/007 (2013.01); Y02B 70/3225 (2013.01); Y04S 20/222 (2013.01)

(58) Field of Classification Search
CPC .......... H02J 2003/007; H02J 3/14; H02J 4/00; G01R 19/0084; G06Q 50/06; Y02B 70/3225; Y04S 20/222
USPC .................................................. 700/286, 295
See application file for complete search history.

(56) References Cited

U.S. PATENT DOCUMENTS

| | | |
|---|---|---|
| 3,558,911 A | 1/1971 | Chen et al. |
| 4,156,280 A | 5/1979 | Griess |
| 4,551,812 A | 11/1985 | Gurr et al. |
| 4,819,180 A | 4/1989 | Hedman et al. |
| 5,268,832 A | 12/1993 | Kandatsu |
| 5,579,197 A * | 11/1996 | Mengelt .................. H02J 9/062 307/66 |
| 7,355,301 B2 | 4/2008 | Ockert et al. |
| 8,204,632 B2 | 6/2012 | Abi-Samra |
| 8,205,106 B2 | 6/2012 | Boss et al. |
| 8,390,977 B2 | 3/2013 | Fife |
| 8,554,383 B2 * | 10/2013 | Toba ......................... H02J 3/46 700/291 |
| 2012/0158196 A1 * | 6/2012 | Eldershaw .............. H02J 3/381 700/287 |
| 2013/0300392 A1 * | 11/2013 | Laur ..................... H02M 3/156 323/284 |
| 2013/0307352 A1 | 11/2013 | Mabuchi et al. |

(Continued)

*Primary Examiner* — Nathan L Laughlin
*Assistant Examiner* — Shon Foley
(74) *Attorney, Agent, or Firm* — Fish & Richardson P.C.

(57) ABSTRACT

In general, one innovative aspect of the subject matter described in this specification can be embodied in a load control system configured to perform load control operations comprising: measuring a voltage on an electrical grid at a plurality of times; determining, for each time of the plurality of times, a difference between a specified normal voltage and the respective measured voltage at that time; summing the differences between the specified normal voltage and the measured voltages to determine a curtailment level; determining whether the curtailment level exceeds a first threshold curtailment level; and in response to determining that the curtailment level exceeds the first threshold curtailment level, adjusting an amount of power drawn by a load.

18 Claims, 8 Drawing Sheets

(56) References Cited

U.S. PATENT DOCUMENTS

| | | | |
|---|---|---|---|
| 2014/0001846 A1* | 1/2014 | Mosebrook | H04L 12/2816 307/11 |
| 2014/0070614 A1 | 3/2014 | Lo et al. | |
| 2014/0129040 A1* | 5/2014 | Emadi | G06Q 50/06 700/291 |
| 2014/0277808 A1* | 9/2014 | Irisarri | G05B 15/02 700/295 |
| 2015/0333517 A1* | 11/2015 | Paquin | H02J 3/38 700/286 |

* cited by examiner

LOAD CURTAILMENT ON AN ELECTRICAL GRID

BACKGROUND

This specification relates to managing loads on an electrical grid.

An electrical grid is an interconnected network for distributing electrical power from power sources to power consumers. An electrical grid can include generating stations that produce electrical power, transmission lines that carry power over large distances to regional centers, and distribution lines that connect to individual loads. One example of an electrical grid is a microgrid that includes multiple loads and optionally power sources that can be operated in coordination with a broader public utility grid or as an electrical island.

SUMMARY

This specification describes a load control system coupled between an electrical grid and a load. The load control system sums the differences between a specified normal voltage and measured voltages to determine a curtailment level. The load control system adjusts an amount of power drawn by the load using the curtailment level. In some implementations, the load control system adjusts the amount of power in response to primary electrical power, e.g., power provided from a utility provider, becoming unavailable, e.g., during a blackout, or not being within predefined operational specifications, e.g., during brown outs.

In general, one innovative aspect of the subject matter described in this specification can be embodied in a system comprising: a power source coupled to an electrical grid and configured to provide power to the electrical grid, wherein the power source is configured to reduce a voltage on the electrical grid as a consequence of a current drawn by the electrical grid exceeding a threshold current; a first load control system coupled between the electrical grid and a first load, wherein the first load control system is configured to perform load control operations comprising: measuring the voltage on the electrical grid at a plurality of times; determining, for each time of the plurality of times, a difference between a specified normal voltage and the respective measured voltage at that time; summing the differences between the specified normal voltage and the measured voltages to determine a curtailment level; determining whether the curtailment level exceeds a first threshold curtailment level; and in response to determining that the curtailment level exceeds the first threshold curtailment level, adjusting an amount of power drawn by the load.

The foregoing and other embodiments can each optionally include one or more of the following features, alone or in combination. The system includes: a second load control system coupled between the electrical grid and a second load; and a system controller configured to communicate with the first and second load systems over a data communications network, wherein the system controller is configured to provide the first threshold curtailment level to the first load control system and to provide a second threshold curtailment level to the second load control system. The system controller is configured to send, to a user device, instructions for presenting a user interface for selecting curtailment thresholds and to receive, from the user device, first and second selections for the first and second threshold curtailment levels. Presenting the user interface comprises presenting a plurality of names for a plurality of loads, and wherein receiving first and second selections for the first and second threshold curtailment levels comprises receiving an ordered list of the names, and wherein the system controller is configured to determine the first and second threshold curtailment levels using the ordered list of names. The power source comprises an inverter coupled to a direct current (DC) bus coupled to a plurality of DC power sources. Summing the differences between the specified normal voltage and the measured voltages to determine the curtailment level comprises multiplying the differences by a weighting factor The electrical grid is coupled to a utility grid, and wherein at least one of the DC power sources is a photovoltaic power system, and wherein the load control system is configured to begin summing the differences as a consequence of determining that the electrical grid is not receiving power from the utility grid. The load control system is configured to reset the summing as a consequence of determining that the differences between the specified normal voltage and the measured voltages are each below a threshold for a specified duration of time. The load control system comprises: a communications device configured to communicate over a data communications network; and a power controller configured to adjust the amount of power drawn by the load. The load control system comprises a microcontroller configured to receive, using the communications device, the first threshold curtailment level from a system controller. The load control system comprises a circuit breaker, and wherein adjusting the amount of power drawn by the load comprises tripping the circuit breaker.

Particular embodiments of the subject matter described in this specification can be implemented to realize one or more advantages. Loads can be curtailed based on a measured voltage and time duration, e.g., a droop voltage appearing for a certain time period, or based on power or load current. The droop voltage can appear as a function of overall load current, e.g., by operation of an inverter. By curtailing certain loads before other loads, load curtailment can be prioritized, preserving power for higher priority loads. Load control systems can curtail loads without directly communicating with a power source by measuring a voltage on a grid. Load control systems can curtail loads on an electrical grid when the grid is disconnected from a utility grid or in other power constrained scenarios, e.g., when power supplied to the grid is transferred from a primary source to a secondary source, or when a heavier load is added to the grid and the grid is drawing power from the secondary source. A secondary power source can deliver power without bringing down the grid voltage by adjusting the load power, e.g., by applying the droop voltage to signal load curtailment. Load curtailment can be applied without being sensitive to voltage measurement error.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTIONS OF DRAWINGS

Like reference numbers and designations in the various drawings indicate like elements.

DETAILED DESCRIPTION

Figure 1:
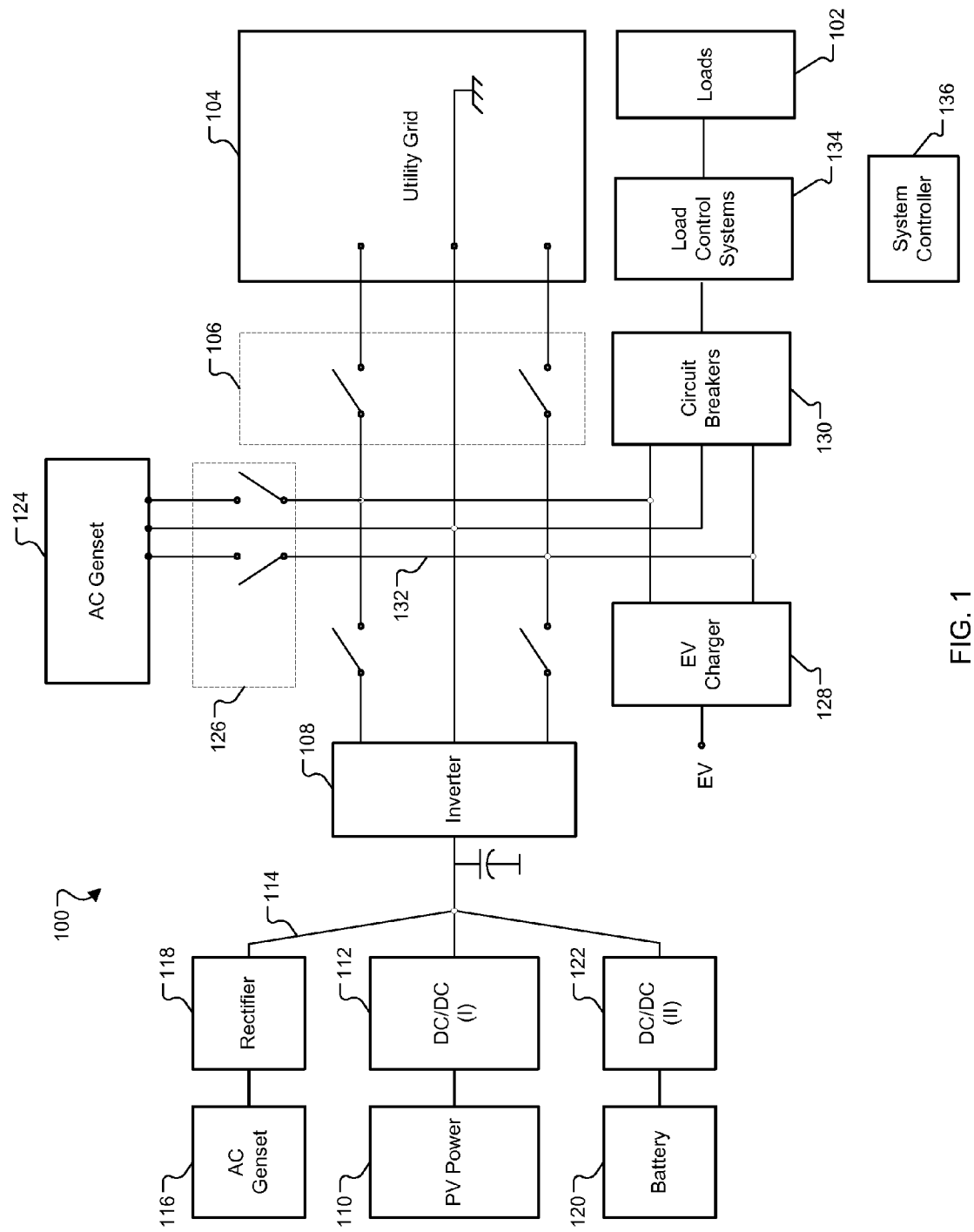
FIG. 1 is a block diagram of an example electrical system.

FIG. 1 is a block diagram of an example electrical system 100. The system includes a number of loads 102 which draw power from various power sources in the system using an electrical grid 132.

The loads 102 can be, e.g., branch circuits in a residence or light commercial facility, each connected to a respective breaker 130. To avoid congestion in the drawings, the loads 102 and breakers 130 are collectively represented by respective single schematic blocks.

A load can be any type of device that draws electrical power, e.g., an appliance within a home, a charging device for an electrical vehicle, manufacturing equipment, and so on. The electrical grid 132 is coupled to a utility grid 104 that provides power to the loads 102. The utility grid 104 is coupled to the electrical grid by a utility grid disconnect switch 106. The utility disconnect switch 106 can be configured to automatically disconnect the utility grid 104 when the utility power fails, e.g., during a blackout, brownout, or some other operational anomaly.

The system includes an inverter 108 coupled to a direct current (DC) bus 114. The DC bus 114 can receive power from various power sources, e.g., a photovoltaic power source 110 coupled to a DC/DC converter 112; a first AC Genset 116 powered by diesel fuel 116 coupled to a rectifier 118; and a battery or battery system 120 coupled to a DC/DC converter 122. These various power sources are local to an entity, e.g., alternate power sources for a house, for example. Additionally, other power sources can also be used instead of the particular power sources 110, 116 and 120 shown in FIG. 1.

The inverter 108 converts DC power on the DC bus 114 to alternating current (AC) power, e.g., real or reactive power or both, that can be consumed by the loads 102 or provided to the utility grid 104. The inverter 108 can produce split AC phases with output voltages of 120 VAC and 240 VAC. The inverter 108 can be configured, e.g., by virtue of suitable programming of a microcontroller, to reduce its output voltage as a consequence of determining that the loads are drawing a current exceeding a threshold current. In some implementations, the inverter 108 is implemented using a circuit topology that lacks a transformer so that the inverter 108 does not provide galvanic isolation between a PV system and the utility grid.

The system includes a second AC Genset 124 coupled to the electrical grid 132 by a Genset disconnect switch 126. The second AC Genset 124 can provide AC power directly to the electrical grid 132; the inverter 108 may operate in parallel with the first AC Genset 116 to power the loads.

The system optionally includes an electric vehicle (EV) charger 128 that draws power from the electric grid 132 to charge an electric vehicle. The EV charger 128 can also be configured for EV discharging, e.g., so that the vehicle's battery can be used to power loads 102 on the electric grid 132.

The system includes circuit breakers 130 or disconnect switches that are configured to provide overcurrent protection to the loads and, in some examples, to curtail the loads. The system also includes load control systems 134, which are configured to communicate with a system controller 136 and to adjust an amount of power drawn by the loads 102. The system controller 136 sends instructions to the load control systems 134 and the load control systems 134 can send monitoring information back to the system controller 136. In some implementations, the load control systems are integrated with the circuit breakers 130, and the circuit breakers 130 are configured to perform load curtailment, or used in a load control system to perform load curtailment. Example load control systems that can be used in the system of FIG. 1 are described further below with reference to FIG. 2A, FIG. 5, and FIG. 6.

The system depicted in FIG. 1 is one example of a system which can use the techniques described in this document. Various other systems can use the techniques, e.g., systems having more or fewer components than those depicted in FIG. 1.

Figure 2A:
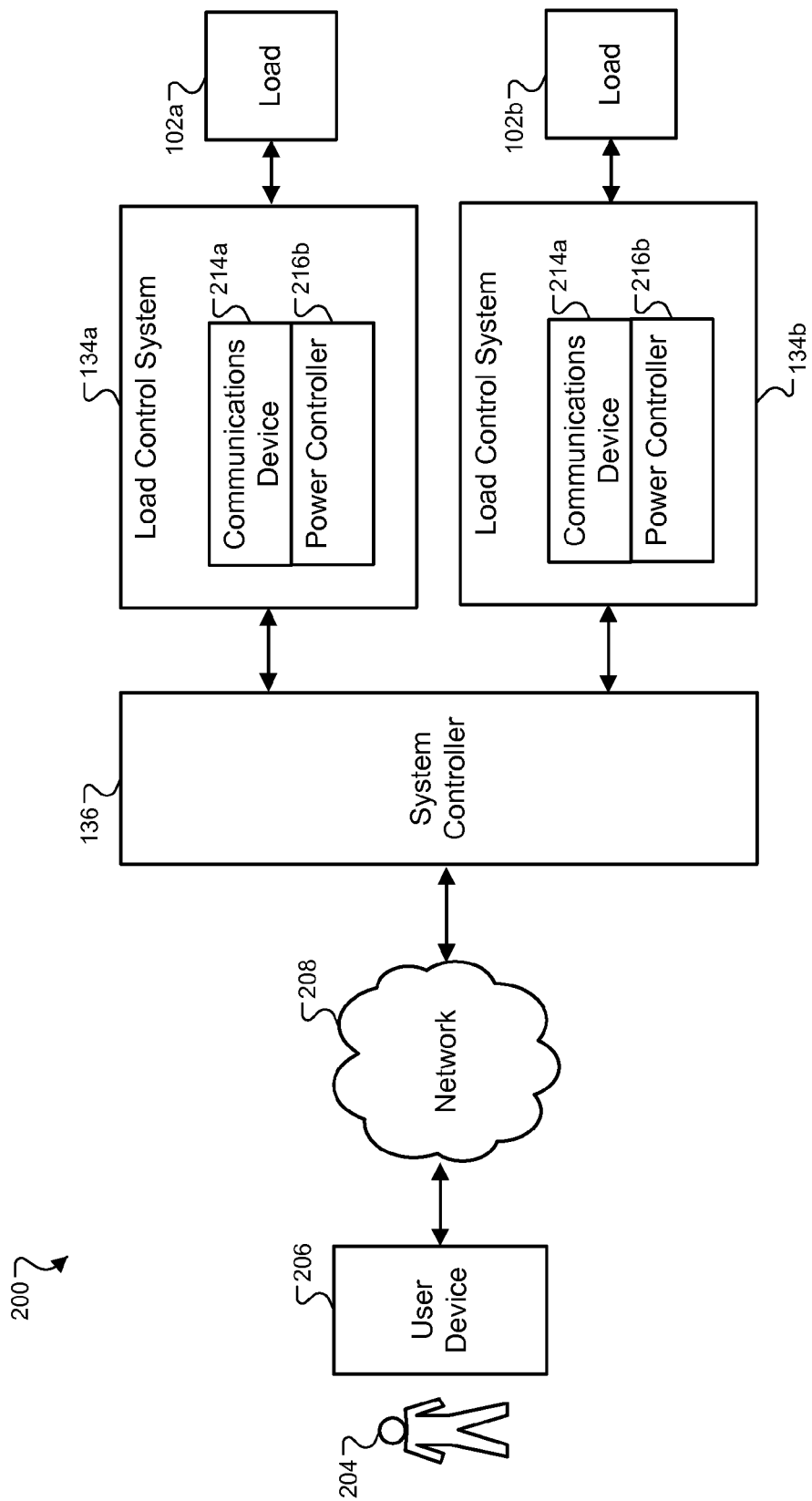
FIG. 2A is a block diagram of an example system for load curtailment.

FIG. 2A is a block diagram of an example system 200 for load curtailment. The system includes a system controller 136 that can be implemented as one or more computers configured to execute instructions for system load curtailment.

A user 204 uses a user device 206, e.g., a mobile device or personal computer, to communicate with the system controller 136 over a data communications network 208, e.g., a WiFi network or the Internet or both. The system controller 136 communicates with a number of load control systems 134a-b that are configured to adjust the amount of power drawn by respective loads 102a-b.

Each load control system 134 includes a power controller 216a-b and a communications device 214a-b. The power controller 216 is configured to adjust the load's real and, in some implementations, reactive power level in response to a signal it receives from the communications device 214.

The power controller 216 can be, e.g. a switch that opens or closes, or it can be a complex power-electronic device with arbitrarily controllable real and reactive power levels, or any appropriate device that can adjust the amount of power drawn by the load. The power controller 216 can be physically integrated with the load or it can be a separate device or integrated into another device. The power controller 216 can be collocated with other loads' power controllers, e.g., in a home's panel or sub-panel.

The communications device 214 is configured to communicate with the system controller 136, e.g., over a wired or wireless communications link. The communications device 214 receives load curtailment information from the system controller 136. The load curtailment information includes one or more parameters that specify when to curtail the load. The load curtailment information can include, e.g., load priority, load curtailment level, a normal voltage range, load power rating, inverter or secondary power source power rating, and so on.

For example, the load curtailment information can specify a threshold curtailment level. The load control system 134 can measure periodically measure the voltage of the load to obtain a measured voltage, and sum the differences between the measured voltages and a specified normal voltage. When the sum reaches the threshold curtailment level, the load control system 134 adjusts the power drawn by the load 102, e.g., by tripping a circuit breaker for the load or sending an instruction to the load 102 to gracefully shut down. Threshold curtailment levels are described further below with reference to FIGS. 5 and 6.

The system controller 136 can send, to the user device 206, instructions for presenting a user interface for selecting threshold curtailment levels. The system controller 136 can then receive, from the user device 206, selections for threshold curtailment levels for the loads 102.

Figure 2B:
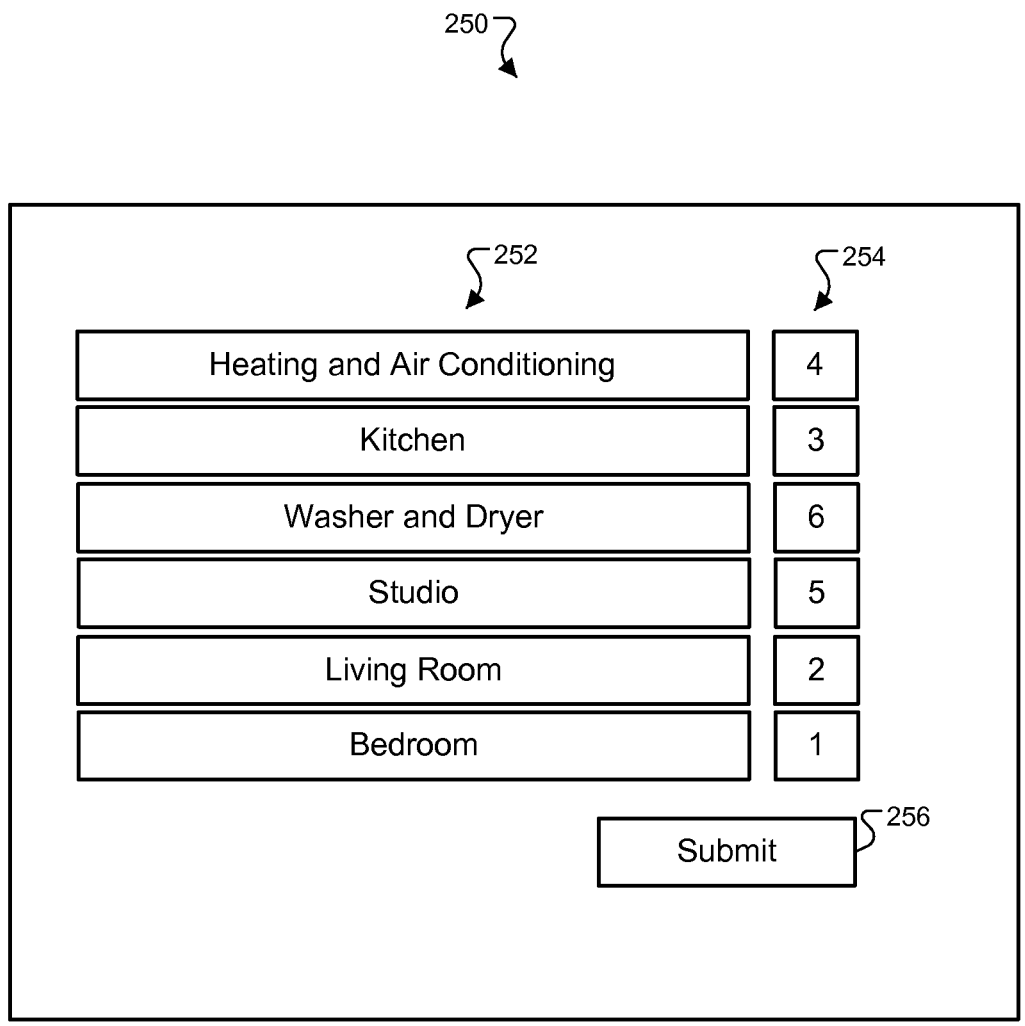
FIG. 2B depicts an example graphical user interface for selecting threshold curtailment levels.

FIG. 2B depicts an example graphical user interface 250 for selecting threshold curtailment levels. The user interface includes a list 252 displaying the names of loads and a list 254 displaying priority ratings for the loads. The user can order the priority of the loads by entering numbers for the priority ratings, resulting in an ordered list of the names of the loads. The system controller can use the ordered list of names to determine threshold curtailment levels. Various other user interfaces are possible, e.g., so that the user reorders the list by moving the names in the list, or so that the user enters the threshold curtailment levels directly instead of ordering the list.

Figure 3:
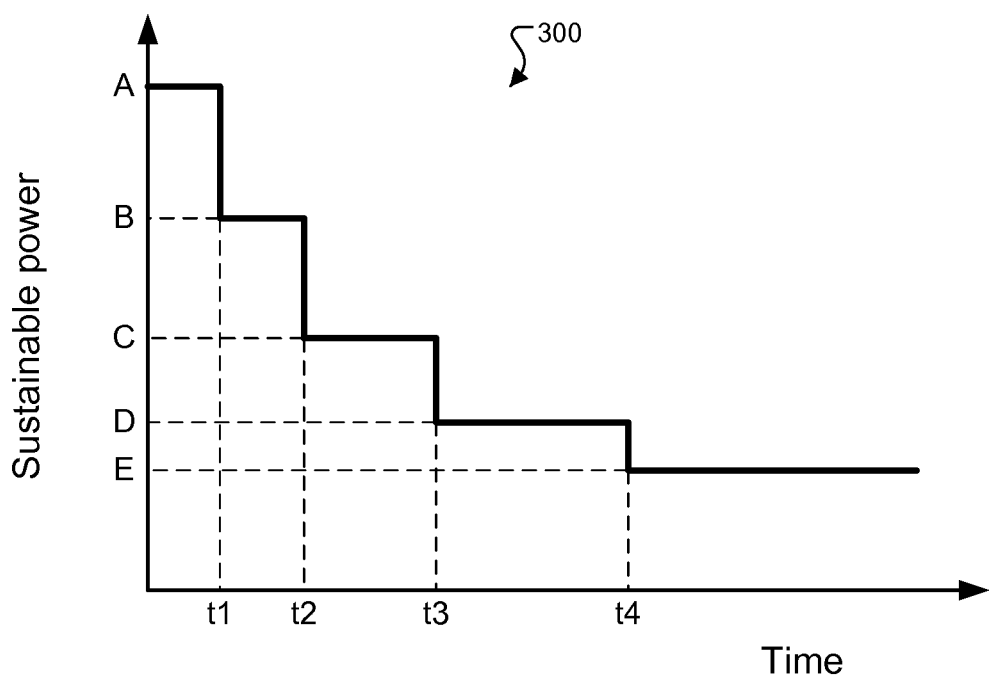
FIG. 3 is a chart showing an example sustainable power curve of a power system.

FIG. 3 is a chart 300 showing an example sustainable power curve of a power system. The power system can be a secondary power source, e.g., the inverter 108 of FIG. 1 being powered by the PV power system 110 of FIG. 1, or the battery 120 and/or one of the AC Gensets. The chart shows a sustainable power rating as a function of time. The chart can be used to determine a curtailment level.

Figure 4A:
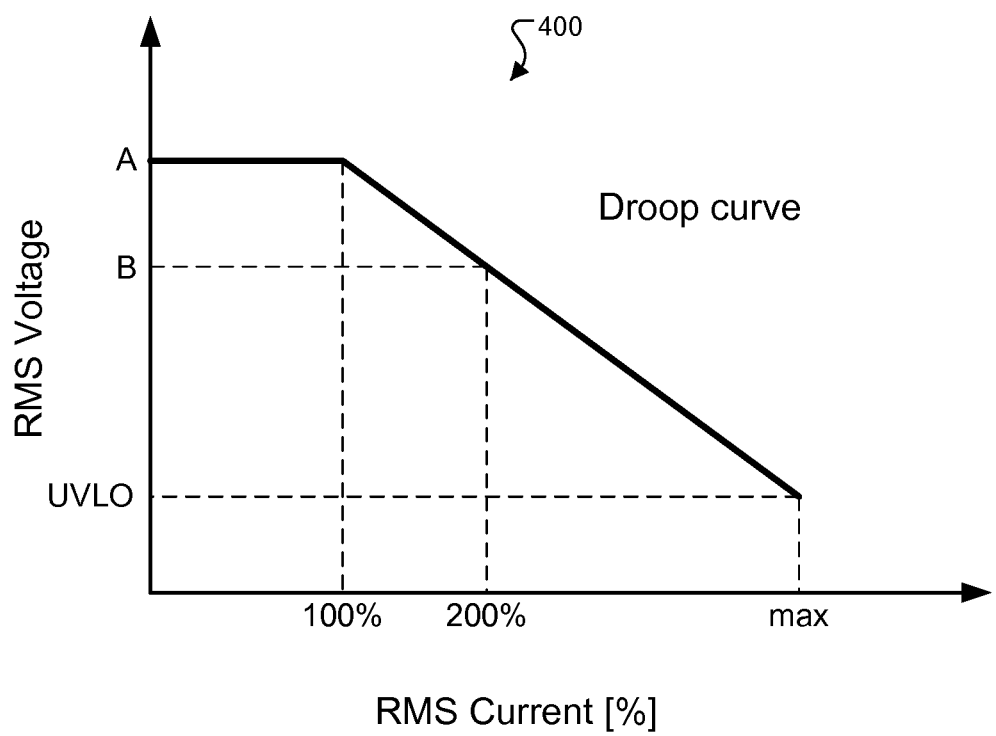
FIG. 4A is a chart showing an example droop curve of the power system.

FIG. 4A is a chart 400 showing an example droop curve of the power system. The horizontal axis of the chart shows the RMS current drawn from the power system, including a 100% RMS current, a 200% RMS current, and a max RMS current. The vertical axis of the chart shows the RMS voltage produced by the power system, including a max voltage, A; a droop voltage, B; and an under voltage lockout (UVLO) voltage.

Up to 100% RMS current, the inverter does not apply any droop voltage, and the inverter outputs the max voltage. For currents greater than 100% RMS current, the inverter applies an increasing droop voltage, so that at 200% RMS current the inverter is supplying on the droop voltage B. Downstream circuits can detect the lower voltage for load curtailment. The inverter will shut off when the voltage drops below the UVLO voltage.

The inverter can be configured to apply the droop voltage, e.g., using a microcontroller or other control system. The control system measures the current being drawn, determines the corresponding droop voltage specified by the droop curve, and then adjusts the inverter operation to produce the droop voltage.

Figure 4B:
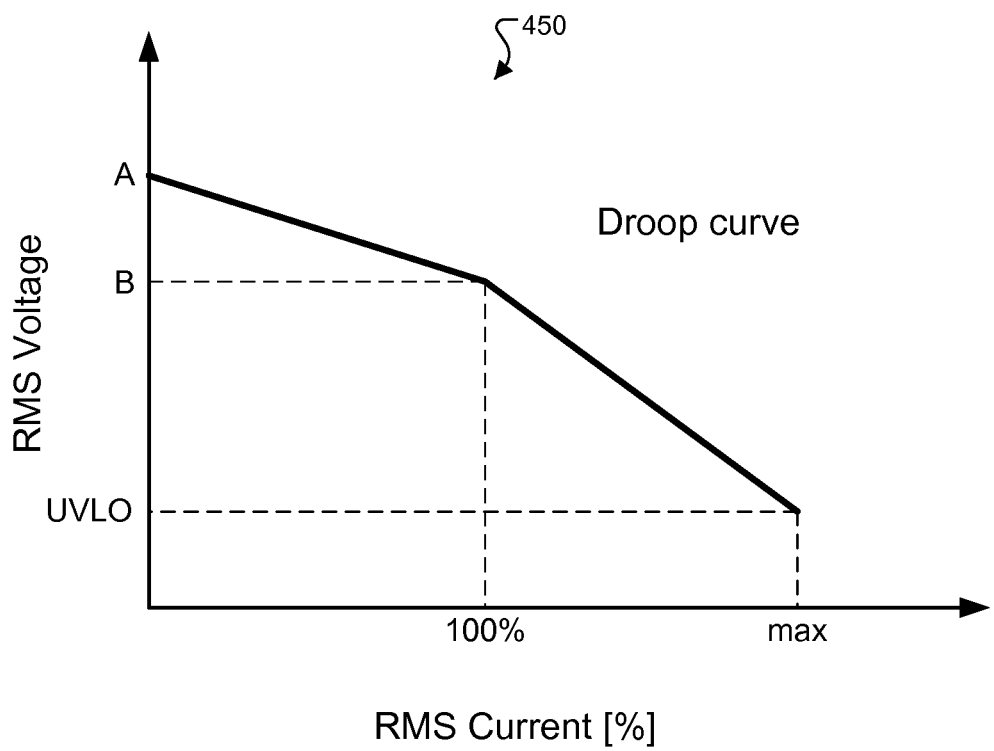
FIG. 4B is a chart showing a different example droop curve of the power system.

FIG. 4B is a chart 450 showing a different example droop curve of the power system. This droop curve can be used, for example, in a power system that includes multiple inverters that operate in parallel. A droop voltage is applied across the entire range of RMS currents. The droop voltage drops more rapidly beyond 100% RMS current.

Figure 5:
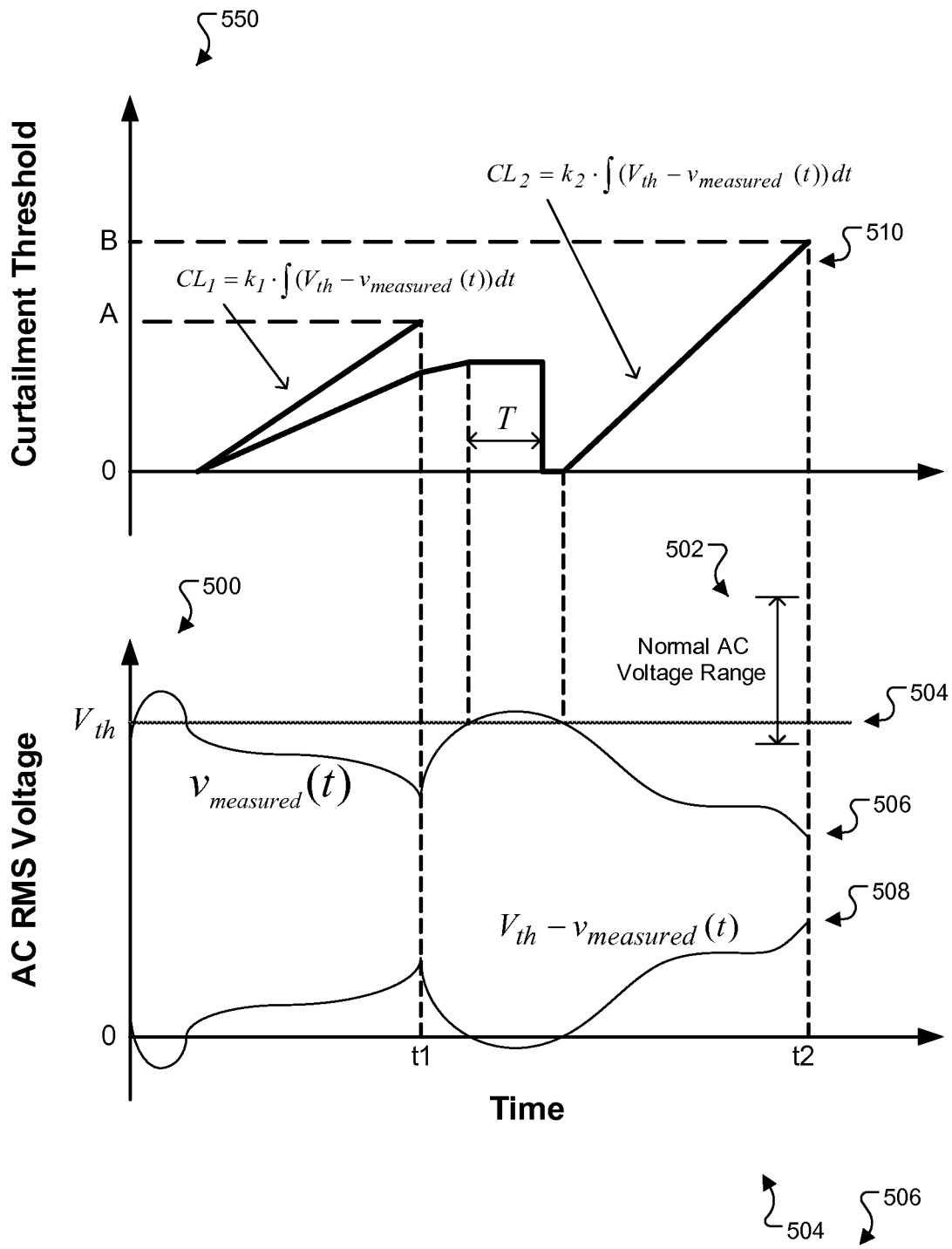
FIG. 5 is a chart illustrating an example scenario where two loads on an electrical grid are curtailed as a consequence of measuring a droop voltage applied by a power source.

FIG. 5 includes two charts 500 and 550 illustrating an example scenario where two loads on an electrical grid are curtailed as a consequence of measuring a droop voltage applied by a power source, e.g., a secondary power source that provides power in the absence of or in addition to a primary power source. The horizontal axis of both charts is a timeline. For example, referring back to FIG. 1, the time can be the time from when the utility grid 104 is disconnected from the electrical grid 132.

The vertical axis of the bottom chart 500 shows the measured voltage on the electrical grid, e.g., the AC RMS voltage. The vertical axis of the top chart 550 shows curtailment thresholds.

A bracket 502 illustrates a range of specified normal voltages. One of the voltages of the range, e.g., the lower bound of the range or the middle of the range, is selected to be the specified normal voltage. The normal voltage can be set by the system controller 202 of FIG. 2A, which can receive the normal voltage from a user or a system designer or other appropriate source. A first curve 504 illustrates the specified normal voltage for this example scenario.

A second curve 506 illustrates an example of measured voltages over time. The load control systems 210a-b of FIG. 2A can measure the voltage. The voltage varies as the power sources applies a droop voltage and loads are curtailed. A third curve 508 illustrates the difference between the measured voltages and the specified normal voltage.

A bold line 510 illustrates a curtailment level as determined for one of the loads on the electrical grid. The curtailment level is determined by continuously summing, i.e., integrating, the differences between the measured voltage and the specified normal voltage multiplied by a weighting factor k. The curtailment level can be expressed as:

$$CL_j = k_j \cdot \int (V_{th} - V_{j,measured}(t)) dt$$

The subscript j denotes a branch of the loads. The subscript k is a weighting factor determined by, e.g., the amount of either load power or load current. k may be slowly changing over time. $V_{th}$ is the lower bound of specified normal AC voltage.

Each load control system can determine the curtailment level and compare the curtailment level with a threshold curtailment level for the load control system's respective load. The system controller 202 of FIG. 2A can specify the threshold curtailment levels for the loads.

At time t1, the curtailment level CL1 reaches a first threshold curtailment level, A. One of the loads, or a first branch of loads, is configured to be curtailed when the curtailment level reaches the first threshold curtailment level. After time t1, the measured voltage begins rising again as a result of that load being curtailed, the curtailment level CL2 rises more slowly and then is reset to zero when the measured voltage is greater than $V_{th}$ for longer than time T.

Eventually, at time t2, the curtailment level CL2 reaches a second threshold curtailment level, B. Another load, or a second branch of loads, is configured to be curtailed when the curtailment level reaches the second threshold curtailment level. After time t2, the measured voltage begins rising again as a result of that other load being curtailed. Because the two loads have been curtailed, the voltage on the electrical grid is maintained for higher priority loads.

In the example shown, the bold line 510 illustrates the curtailment level for all of the devices, because in this example all the devices see about the same voltage. In a different setting, e.g., a light commercial setting, the voltage may vary across a grid and each load control system will have a different curtailment level. The curtailment level can be based on the priority of each load or branch of loads.

Figure 6:
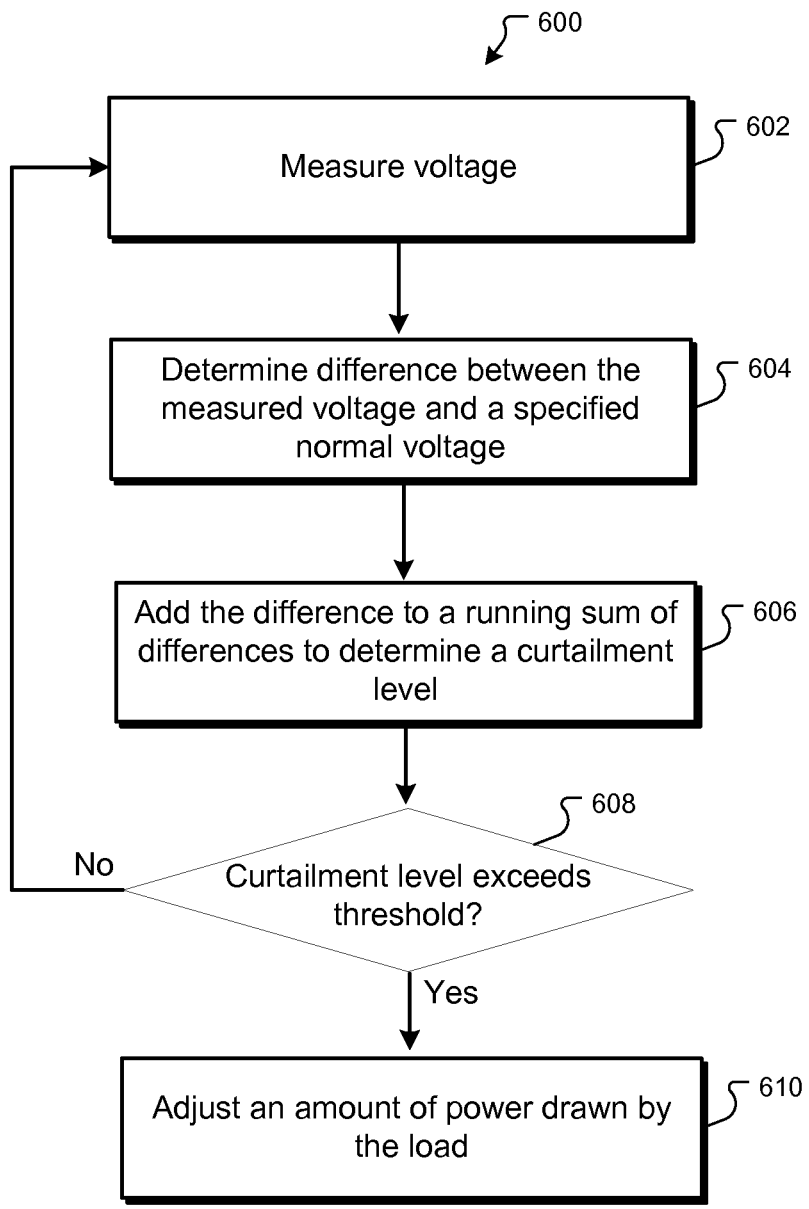
FIG. 6 is a flow diagram of an example process performed by a load control system coupled between an electrical grid and a load.

FIG. 6 is a flow diagram of an example process 600 performed by a load control system coupled between an electrical grid and a load. The load control system measures the voltage on the grid (602). The load control system determines the difference between the measured voltage and a specified normal voltage (604). The load control system adds the difference to a running sum of the differences to determine a curtailment level (606). The load control system compares the curtailment level to a threshold curtailment level (608), and if the curtailment level exceeds the threshold curtailment level, adjusts an amount of power drawn by the load (610).

The load control system can begin performing the process as a consequence of determining that the electrical grid is not receiving power from a utility grid, e.g., and is instead receiving power from a secondary power source. For example, the load control system can receive a signal from a utility disconnect switch that the utility grid has been disconnected. In some implementations, the load control system is configured to reset the summing, e.g., by setting the curtailment level to zero, as a consequence of determining that the differences between the specified normal voltage and the measured voltages are each below a threshold for a specified duration of time, or that the measured voltage is greater than a specified normal voltage for a specified duration of time.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, a computer, or multiple processors or computers. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, the subject matter is described in context of scientific papers. The subject matter can apply to other indexed work that adds depth aspect to a search. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:

1. A system comprising:
a power source coupled to an electrical grid and configured to provide power to the electrical grid, wherein the power source is configured to reduce a voltage on the electrical grid as a consequence of a current drawn by the electrical grid exceeding a threshold current;
a first load control system coupled between the electrical grid and a first load, wherein the first load control system is configured to perform load control operations comprising:
measuring the voltage on the electrical grid at a plurality of times, and for each measuring of the voltage:
determining a difference between a specified normal voltage and the respective measured voltage at that time to obtain a difference value;
determining a curtailment level that is a summation of each of the difference values determined at each of the plurality of times, wherein the summation is reset when the difference values are each below a threshold for a specified duration of time;
determining whether the curtailment level exceeds a first threshold curtailment level; and
in response to determining that the curtailment level exceeds the first threshold curtailment level, adjusting an amount of power drawn by the load.

2. The system of claim 1, comprising:
a second load control system coupled between the electrical grid and a second load; and
a system controller configured to communicate with the first and second load systems over a data communications network, wherein the system controller is configured to provide the first threshold curtailment level to the first load control system and to provide a second threshold curtailment level to the second load control system.

3. The system of claim 2, wherein the system controller is configured to send, to a user device, instructions for presenting a user interface for selecting curtailment thresholds and to receive, from the user device, first and second selections for the first and second threshold curtailment levels.

4. The system of claim 3, wherein presenting the user interface comprises presenting a plurality of names for a plurality of loads, and wherein receiving first and second selections for the first and second threshold curtailment levels comprises receiving an ordered list of the names, and wherein the system controller is configured to determine the first and second threshold curtailment levels using the ordered list of names.

5. The system of claim 1, wherein the power source comprises an inverter coupled to a direct current (DC) bus coupled to a plurality of DC power sources, and wherein determining that the curtailment level is the summation of each of the difference values determined at each of the plurality of times comprises multiplying the summation of each of the different values determined at each of the plurality of times by a weighting factor.

6. The system of claim 5, wherein the electrical grid is coupled to a utility grid, and wherein at least one of the DC power sources is a photovoltaic power system, and wherein the load control system is configured to begin summing each of the difference values determined at each of the plurality of times as a consequence of determining that the electrical grid is not receiving power from the utility grid.

7. The system of claim 1, wherein the load control system comprises:
a communications device configured to communicate over a data communications network; and
a power controller configured to adjust the amount of power drawn by the load.

8. The system of claim 7, wherein the load control system comprises a microcontroller configured to receive, using the communications device, the first threshold curtailment level from a system controller.

9. The system of claim 1, wherein the load control system comprises a circuit breaker, and wherein adjusting the amount of power drawn by the load comprises tripping the circuit breaker.

10. The system of claim 1, wherein the weighting factor is variable over the plurality of times.

11. A load control system configured to be coupled between an electrical grid and a load, wherein load control system is configured to perform load control operations comprising:
measuring the voltage on the electrical grid at a plurality of times, and for each measuring of the voltage:
determining a difference between a specified normal voltage and the respective measured voltage at that time to obtain a difference value;
determining a curtailment level that is a summation of each of the difference values determined at each of the plurality of times, wherein the summation is reset when the difference values are each below a threshold for a specified duration of time; and
as a consequence of determining that the curtailment level exceeds a threshold curtailment level, adjusting an amount of power drawn by the load.

12. The load control system of claim 11, wherein determining that the curtailment level is a summation of each of the difference values determined at each of the plurality of times comprises beginning summing each of the difference values determined at each of the plurality of times as a consequence of determining that the electrical grid is not receiving power from a utility grid.

13. The load control system of claim 11, comprising:
a communications device configured to communicate over a data communications network;
a power controller configured to adjust the amount of power drawn by the load; and
a microcontroller configured to receive, using the communications device, the first threshold curtailment level from a system controller.

14. The load control system of claim 11, comprising a circuit breaker, wherein adjusting the amount of power drawn by the load comprises tripping the circuit breaker.

15. A method performed by a load control system coupled between an electrical grid and a load, the method comprising:
measuring the voltage on the electrical grid at a plurality of times, and for each measuring of the voltage:
determining a difference between a specified normal voltage and the respective measured voltage at that time to obtain a difference value;
determining a curtailment level that is a summation of each of the difference values determined at each of the plurality of times, wherein the summation is reset when the difference values are each below a threshold for a specified duration of time; and as a consequence of determining that the curtailment level exceeds a threshold curtailment level, adjusting an amount of power drawn by the load.

16. The method of claim 15, wherein determining that the curtailment level is a summation of each of the difference values determined at each of the plurality of times comprises beginning summing each of the difference values determined at each of the plurality of times as a consequence of determining that the electrical grid is not receiving power from a utility grid.

17. The method of claim 15, comprising receiving, using a communications device configured to communicate over a data communications network, the first threshold curtailment level from a system controller.

18. The method of claim 15, wherein adjusting the amount of power drawn by the load comprises tripping a circuit breaker.

* * * * *

UNITED STATES PATENT AND TRADEMARK OFFICE
CERTIFICATE OF CORRECTION

PATENT NO. : 9,966,761 B1
APPLICATION NO. : 14/285978
DATED : May 8, 2018
INVENTOR(S) : Kim et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 611 days.

Signed and Sealed this
Eighteenth Day of December, 2018

Andrei Iancu
*Director of the United States Patent and Trademark Office*